United States Patent
Dragan

(10) Patent No.: US 6,642,708 B1
(45) Date of Patent: Nov. 4, 2003

(54) MARKER SYSTEM FOR TEST FIXTURE

(75) Inventor: Mark Dragan, Lakeville, MN (US)

(73) Assignee: Mark Jay Dragan, Lakeville, MN (US)

( * ) Notice: Subject to any disclaimer, the term of this patent is extended or adjusted under 35 U.S.C. 154(b) by 220 days.

(21) Appl. No.: 09/782,785

(22) Filed: Feb. 14, 2001

(51) Int. Cl.$^7$ .......................... G01R 31/02; G01D 15/16
(52) U.S. Cl. ................... 324/158.1; 346/140.1; 324/754
(58) Field of Search .................. 324/754, 755, 324/765, 158.1; 346/140.1, 141

(56) References Cited

U.S. PATENT DOCUMENTS

| | | | |
|---|---|---|---|
| 3,780,570 A | * 12/1973 | Collins | 73/600 |
| 3,943,527 A | 3/1976 | Hartmann | 346/33 |
| 4,144,536 A | * 3/1979 | Ardezzone et al. | 346/33 F |
| 4,506,999 A | 3/1985 | Robertson | 400/121 |
| 4,568,879 A | * 2/1986 | Nakamura et al. | 324/759 |
| 4,721,908 A | 1/1988 | Driller et al. | 324/158 |
| 5,204,912 A | 4/1993 | Schimanski | 382/8 |
| 5,214,374 A | 5/1993 | St. Onge | 324/158 |
| 5,396,186 A | 3/1995 | Scheutzow | 324/754 |
| 5,399,982 A | 3/1995 | Driller et al. | 324/754 |
| 5,416,428 A | 5/1995 | Swart | 324/759 |
| 6,135,022 A | 10/2000 | Troester | 101/18 |

* cited by examiner

*Primary Examiner*—Vinh P. Nguyen
*Assistant Examiner*—Russell M. Kobert
(74) *Attorney, Agent, or Firm*—Kinney & Lange P.A.

(57) ABSTRACT

The present invention is a test system for testing functionality of a manufactured component. The test system has a test fixture, a control unit and a marker assembly. The test fixture transmits tests signals to, and receives tests signals from, the manufactured component. The control unit produces test signals and transmits the test signals to, and receives tests signals from, the test fixture. The control unit also produces a result signal dependant on the received test signals. The control unit further produces an actuating signal in response to certain test signals. The marker assembly contains a marking material and is mounted in the test fixture. The marker assembly is configured to receive the actuating signal such that the marker assembly actuates in response to the actuating signal. Upon actuation, the marker assembly physically contacts the manufactured component leaving marking material on the manufactured component.

12 Claims, 6 Drawing Sheets

MARKER SYSTEM FOR TEST FIXTURE

BACKGROUND OF THE INVENTION

The present invention relates to a test system for testing an article of manufacture. More specifically, the present invention relates to testing and marking a printed circuit board.

When a printed circuit board is manufactured, it is often desirable to test various points in a circuit on the printed circuit board to determine whether the circuit is fully functional. Often, hundreds of test points on the circuit board must be selectively tested. This is generally accomplished using a printed circuit board tester, which typically includes a test fixture mounted in a tester that is electrically coupled to a computer. Generally, test fixtures have a large number of pins or have a large number of spring-biased test probes arranged to make, electrical contact with designated test points on the circuit board under test. The pins or probes are supported by a plate or multiple plates.

Any particular circuit laid out on a printed circuit board is likely to be different from other circuits. When the circuit to be tested is designed, a pattern of test points to be used in checking the circuit is selected. A corresponding array test pins or probes is then configured in the test fixture. This typically involves drilling a pattern of holes in the plate or plates to match the customized array of test pins or probes, and then mounting the test pins or probes in the drilled holes in the plate. The printed circuit board is then placed immediately adjacent the test fixture for testing. During testing, the ends of the test pins or probes are brought into contact with the test points in the circuit board under test. The other ends of the test pins or probes are electrically coupled to a test computer. Depending on the type of test fixture used, electrically coupling pins or probes to a test computer may be accomplished by a variety of methods. For instance, test pins in a test fixture may be pressed against a bed of nails that are electrically coupled to the test computer. In another application, each of the test probes in a test fixture may be hard-wired to connectors or transfer pins that transmit signals directly to and from the test computer.

Once the test pins or probes are brought into contact with the test points in the circuit board during testing, electrical test signals are transferred from the test computer through the test pins or probes to the board under test, and test signals are then transferred back to through the test pins or probes back to the test computer. The test computer detects continuity or lack of continuity between various test points in the circuits on the printed circuit board based on the test signals received. At the end of each test, the test computer produces a pass or a fail signal to indicate that tile board has either passed or failed the test.

After a test or a printed circuit board has been completed, it is desirable to indicate whether the tested circuit board is functional or whether it is not functional, based on whether the board passed or failed the test. It is typical to have an operator visually monitor the test computer. The operator then manually separates the good boards from the bad board based on the test results of the test computer. The good boards may be identified by manually stamping and identifying mark on the board. This method of indicating the outcome of a test has limitations. Relying on an operator is subject to operator error. Generally, experience has shown that some boards that were tested and shown to be bad boards as a result of the test, end up marked as good boards. Relying on operators to separate boards also adds an additional step that slows the testing process. It also risks the possibility of an operator inadvertently damaging the circuit board, which is typically sensitive to physical damage to the circuit board.

Various systems for automated marking of articles of manufacture are known. However, their applicability to printed circuit boards is limited. Many known systems mark an article of manufacture by etching or making other physical indentations on the article under test. This is not desirable in a printed circuit board, as etching or otherwise cutting into a printed circuit board often has a high degree of risk of damage.

Other marking systems rely on spraying and ink or paint and are simply too large and cannot perform adequately in the very limited space environment of a printed circuit board test system. Often, printed circuit boards carry many components and have many conductive paths. Because of the relatively dense population of conductive paths, there is very little space to mark the boards. A test system that overcomes the disadvantages of the prior art, would be desirable

BRIEF SUMMARY OF THE INVENTION

The present invention is a testing and marking system for an article of manufacture such as a printed circuit board. The test system includes a test fixture, a control unit, and a marker assembly. After a component is manufactured, it is placed in proximity to the test system of the present invention. The test fixture is configured to receive test signals from the control unit and pass these signals through the circuit board and back to the control unit dependent on connections in the circuit board. The control unit then compares these signals to a stored netlist of a good board. The test signals received back from the circuit board are indicative of the condition of the circuit board. The control unit then generates a result signal The marker assembly is responsive to the result signal and is configured to mark the component in response to the result signal.

DETAILED DESCRIPTION

Figure 1:
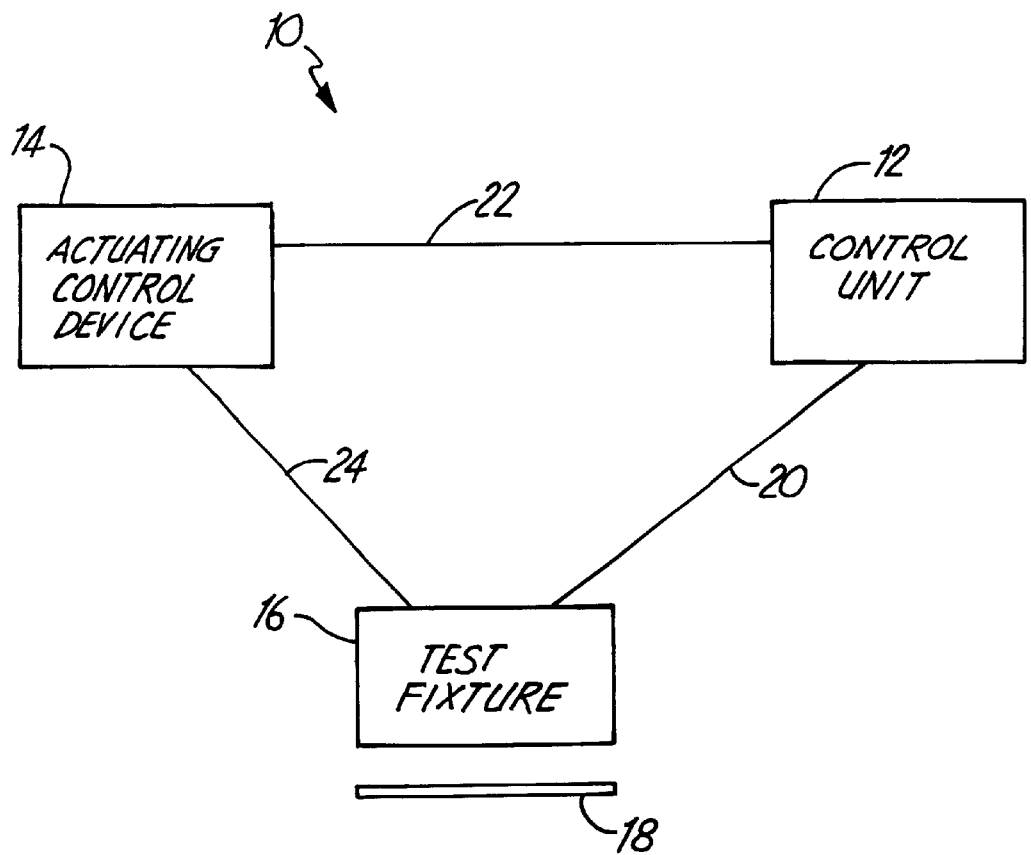
FIG. 1 is a test and marking system in accordance with the present invention.

FIG. 1 shows test and marking system 10 in accordance with the present invention. Test and marking system 10 includes control unit 12 actuating control device 14 and test fixture 16. Printed circuit board 18 is shown adjacent fixture 16. Control unit 12 is coupled to fixture 16 by test signal lines 20 and is coupled to actuating control device 14 by result signal line 22. Actuating control device 14 is coupled to test fixture 16 by actuating signal line 24.

In operation test and marking system 10 is used to test the functionality of printed circuit board 18 after it is manufactured and mark it accordingly. More specifically, test and marking system 10 tests the particular circuit layout of printed circuit board 18 in order to detect proper functionality of the circuit. Circuit board 18 is placed immediately adjacent one side of fixture 16 such that electrical contact is made between test fixture 16 and certain points of the circuit on printed circuit board 18. Control unit 12 is commonly a computer or other microprocessor-based unit that has control functions and is capable of sending, receiving and analyzing test signals. Control unit 12 sends test signals over test signal lines 20 to test fixture 16, and then to printed circuit board 18. Control unit 12 then receives test signals back from printed circuit board 18, through fixture 16, over test signal lines 20.

Control unit 12 is programmed with a stored test program that includes a stored netlist that is reflective of a properly functioning circuit board. Control unit 12 receives the electrical test signals and the test program compares these test signals to the stored netlist to determine the functionality of the circuit on printed circuit board 18. The result of this analysis will indicate whether printed circuit board 18 has passed or failed the test. A result signal is sent over result signal line 22 to actuating control device 14. If the result signal indicates that printed circuit board 18 failed the test, actuating control device 14 does not send a signal to test fixture 16 over actuating signal line 24. However, if the result signal indicates that printed circuit board 18 passed the test, actuating control device 14 sends a actuating signal over actuating signal line 24 to test fixture 16. Test fixture 16, responsive to the actuating signal from actuating control device 14, actuates against printed circuit board 18 leaving a permanent mark on printed circuit board 18 that indicates it has passed the test.

Figure 2:
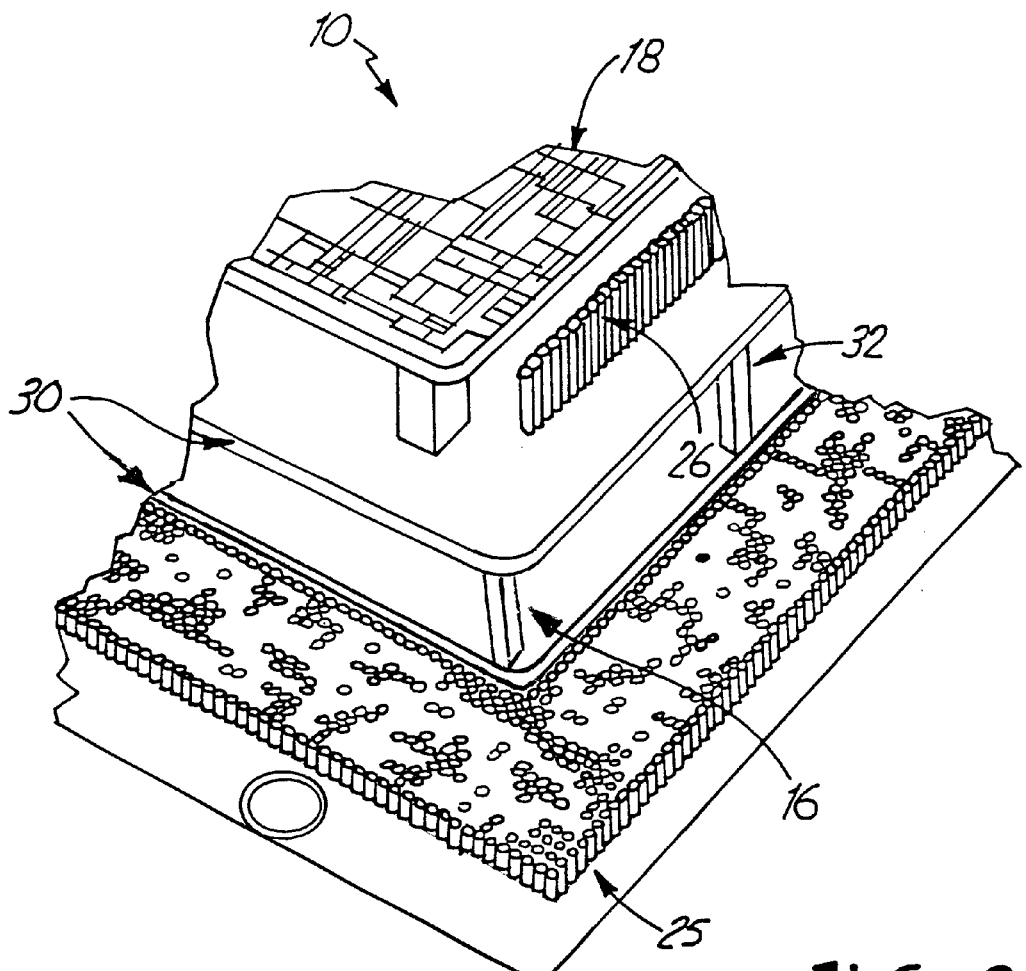
FIG. 2 is perspective view of a portion of test and marking system in accordance with the present invention.

FIG. 2 shows a portion of a test and marking system 10 in accordance with the present invention. Test and marking system 10 includes test fixture 16, printed circuit board 18, bed of nails 25, and test pins 26.

Test fixture 16 includes a marker assembly 28 (not shown in FIG. 2), a plurality of plates 30 and supports 32. Supports 32 support the plates relatively parallel to each other. Test fixture 16 is shown resting on bed of nails 25. Test fixture 16 supports a multitude of test pins 26 relatively perpendicular to its plates 30. Test fixture 16 also supports marker assembly 28, which will be shown and discussed in detail below in conjunction with FIG. 3. Printed circuit board 18 is shown resting on the ends of the multitude of test pins 26.

Bed of nails 25 contains thousands of individual spring probes that are spaced apart in a grid. Each spring probe is spaced from each other immediately adjacent spring probe such that the center of the spring probe is one tenth of one inch from each immediately adjacent spring probe. This is commonly referred to as a "100 mil grid." Bed of nails 25 is coupled to control unit 12 via test signal lines 20. Control unit 12 can send test signals over signal lines 20 to each of the spring probes in bed of nails 25, and can also receive test signals over signal lines 20 from each of the spring probes in bed of nails 25. The signals received from bed of nails 25 are analyzed to produce a result signal as explained above.

The multitude of pins 26 are supported in fixture 16. Typically, holes are drilled in plates 30 through which pins 26 are placed. One end of each of pins 26 is configured to contact a spring probe in the bed of nails 25. The opposite end of pins 26 is configured to contact the circuit on printed circuit board 18 at a selected test point. Each circuit to be tested on printed circuit board 18 will have a unique configuration of test points, thus each fixture will have a corresponding unique configuration of test pins 26. With pins 26 contacting both bed of nails 25 and printed circuit board 18, test signals are transmitted from control unit 12, through a spring probe in the bed of nails 25, through a pin 26 that is in contact with that spring probe, and to the circuit at a selected test point. Similarly, test signals are transmitted from selected test points, through pin 26, through a spring probe in bed of nails 25 that is in contact with that pin 26, and to control unit 12.

The holes in plates 30 are drilled such that one of the ends of pins 26 are directed to the selected test points in the circuit on printed circuit board 18, and the opposite ends of pins 26 are in contact with individual spring probes in bed of nails 25. Because the test points on printed circuit board 18 are typically closer together than are the spring probes in the 100 mil grid of bed of nails 25, pins 26 are typically at a slight angle or pitch relative to perpendicular to plates 30.

Although test and marking system 10 contemplates a wide variety of test fixtures used in a wide variety of testers, the test fixture 16 shown in FIG. 2 is used to illustrate the present invention. Test fixture 16 is a soft fixture that is typically used with a bed of nails tester that interfaces with a computer. The Everett Charles 9090 double sided electrical tester is an example of such a tester. Dedicated fixturing is an alternative to this soft fixturing that works equally well with the present invention. With a dedicated fixture, spring-biased test probes are typically used in place of pins. These probes are then hard-wired at one end to the test computer, typically via transfer pins or the like, and then pushed against the circuit under test at the other end. For example, one such test fixture is described in U.S. Pat. No. 5,399,982, which is incorporated by reference herein. Marker assembly 28, which will be described in detail below, works well in accordance with the present invention in these and a wide variety of other testers known to those of ordinary skill in the art.

Figure 3:
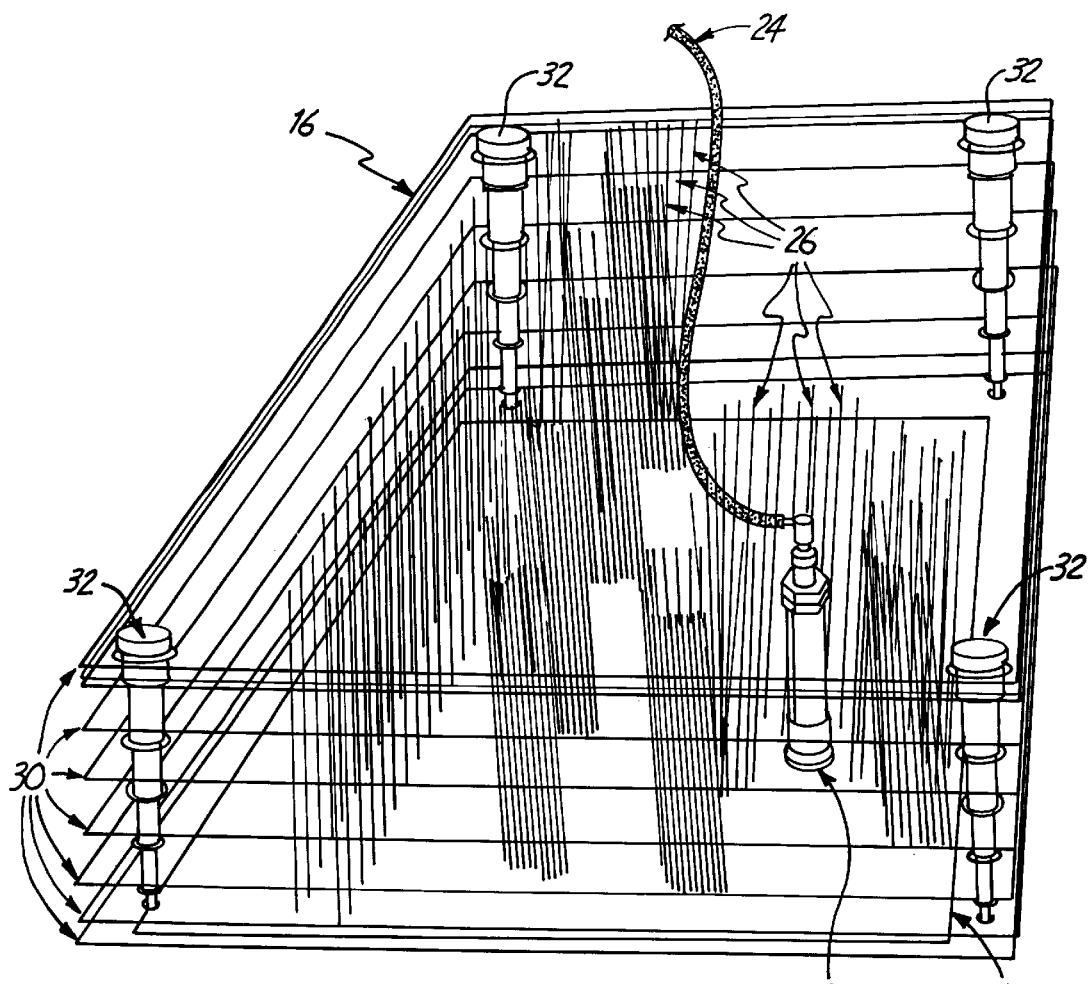
FIG. 3 is a perspective view of a fixture and marker assembly in accordance with the present invention.

FIG. 3 shows a portion of test and marking system 10, including test fixture 16. Test fixture 16 includes a plurality of test pins 26, marker assembly 28, a plurality of plates 30, and a plurality of supports 32. Test fixture 16 is shown above printed circuit board 18. Actuating signal line 24 is shown connected to marker assembly 28. Plates 30 are ghosted to better illustrate the portions below. It should be noted that the portion of test and marking system 10 shown in FIG. 2 is oriented upside down relative to the portion of test and marking system 10 shown in FIG. 3. More specifically, test fixture 16 is shown above printed circuit board 18 in FIG. 3 and test fixture 16 is shown below printed circuit board 18 in FIG. 2. Either orientation is used equally well in test and marking system 10 in accordance with the present invention, and in fact, both can be used at once in a single application. For example, in testing a dual-sided surface mount (SMT) circuit board one fixture is oriented above the printed circuit board and a second fixture is oriented below the printed circuit board. Similarly, one bed of nails is oriented above the upper fixture and a second bed of nails is oriented below the lower fixture.

Supports 32 support the plurality of plates 30 such that they are spaced apart in parallel planes, one above the other. Each plate 30 has holes drilled to accommodate the plurality of test pins 26. Typically, a soft fixture such as test fixture 16 includes several relatively parallel plates supported on supports 32. Generally, fixture 16 will have more plates when the test points on printed circuit board 18 are close together and less plates when the test points are farther apart. The number of plates 30 may vary from as little as two to as many as nine. The plurality of test pins 26 are then supported substantially perpendicularly to plates 30. Although test pins 26 are generally perpendicular to plates 30, they may actually be supported at slight angles relative to plates 30 depending on how close together the test points are. Test pins 26 are movable in a direction perpendicular to plates 30, but are prevented from falling out of fixture 16 in a variety of ways. For example, a rubber sheet (not shown in FIG. 3) with holes corresponding to pins 26 can be used to allow pins 26 to move slightly in the direction perpendicular to plates 30, but friction between the rubber sheet and pins 26 prevents pins 26 from falling out of fixture 16.

Marker assembly 28 is mounted in fixture 16. Plates 30 are drilled to accommodate marker assembly 28. Marker assembly 28 must be located in a position within fixture 16 where it will not interfere with test pins 26, but such that an end is immediately adjacent printed circuit board 18 so that is can physically make contact therewith.

In operation of test and marking system 10 as partially illustrated in FIG. 3, bed of nails 25 is urged down onto fixture 16, the spring probes in bed of nails 25 thereby engaging pins 26 and urging them down onto the selected test points of the circuit on printed circuit board 18. In this way, test signals can be transmitted from control unit 12, through bed of nails 25, through pins 26, and to the circuit at the selected test point, and test signals can be transmitted from other test points, through pins 26, through bed of nails 25 and to control unit 12.

Control unit 12 then analyzes these test signals in accordance with a stored test program. Based on this test program, a result is determined. Either the printed circuit board 18 will pass or fail the test based on the functionality of the circuit on printed circuit board 18. This result signal, either pass or fail, is then sent via result signal line 22 to actuating control device 14. If the result signal indicates printed circuit board 18 has passed, then actuating control device 14 sends an actuating signal over actuating signal line 24 to marker assembly 28. This actuating signal causes actuation within marker assembly 28 which then urges a portion of marker assembly 28 against printed circuit board 18 leaving a permanent mark on printed circuit board 18, indicating that printed circuit board 18 has passed the test. If the result signal indicates that printed circuit board failed, then actuating control device 14 does not send an actuating signal and the portion of marker assembly 28 does not actuate against printed circuit board 18. In this way, only printed circuit boards that pass the test will have a mark.

Figure 4:
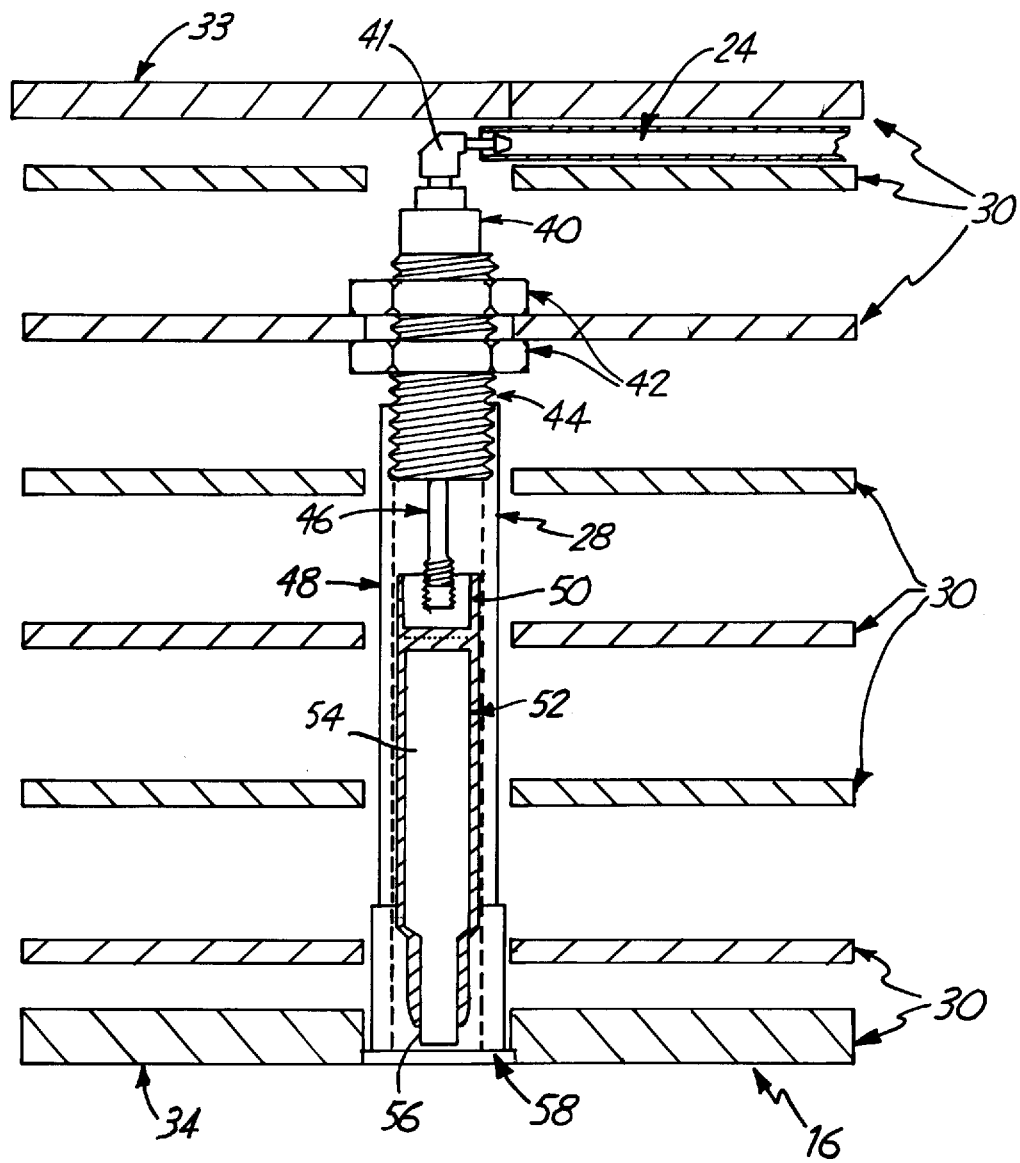
FIG. 4 is a partial cross-sectional view of a fixture and marker assembly in accordance with the present invention.
Figure 4A:
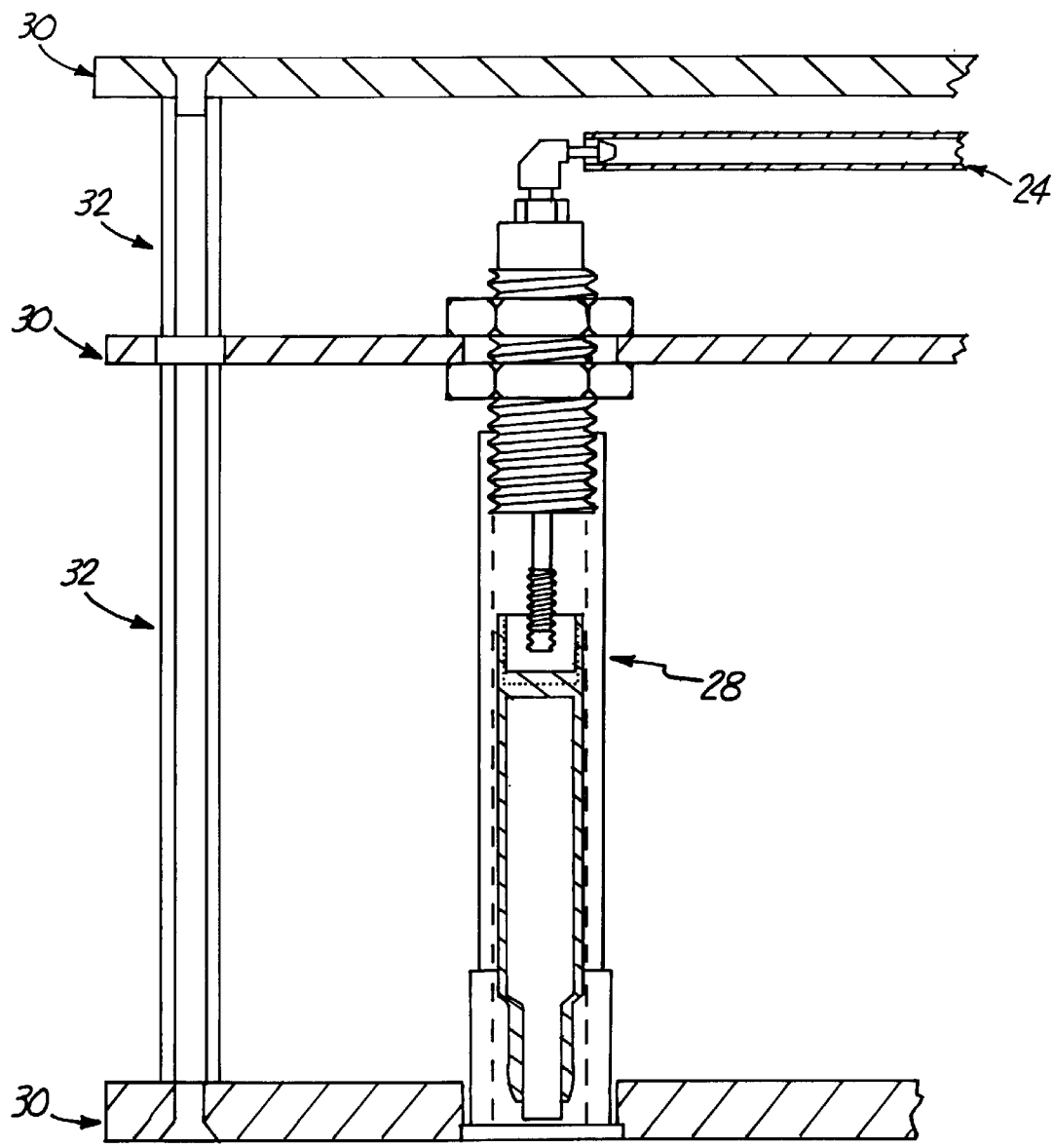
FIG. 4a is a partial cross-sectional view of an alternative fixture and marker assembly in accordance with the present invention.

FIG. 4 shows a portion of test and marking system 10 including fixture 16 and marker assembly 28. The portion of fixture 16 shown includes plates 30, including master plate 33 and target plate 34. Pins 26 are not shown. Marker assembly 28 is shown coupled to actuating signal line 24. Marker assembly 28 further includes pneumatic air device 40, fasteners 42, threads 44, plunger 46 guide cylinder 48, mounting insert 50, and ink canister 52. Guide cylinder 48 has a guide lip 58. Ink canister 52 contains ink 54 and has a felt tip 56. FIG. 4a shows a portion of an alternative test and marking system 10 in accordance with the present invention.

Master plate 33 interfaces with bed of nails 25 (not shown in FIGS. 4 and 4a) and target plate 33 interfaces with circuit board 18 (not shown in FIGS. 4 and 4a). As alluded to earlier, whether the interface with circuit board 18 is above or below fixture 18 is immaterial to the invention, and in fact, some embodiments will have a fixture above and below printed circuit board 18 in order to test both sides at once. Marker assembly 28 is mounted in fixture 16 such that guide lip 58 is fixed in target plate 34 and felt tip 56 is immediately proximate thereto. In this way, when circuit board 18 is placed immediately adjacent target plate 34, the actuation of marker assembly 28 allows felt tip 56 to physically contact circuit board 18.

Plates 30 of fixture 16 are provided with holes through which marker assembly 28 is mounted. Many plates 30 may be used (as shown in FIG. 4) or only a few plates 30 could be used (as shown in FIG. 4a). The specific number of plates used is not part of the present invention. Fasteners 42 may be used to secure marker assembly to fixture 16. For example, fasteners 42 may be placed above and below plate 30 and threadably adjusted via threads 44 such that they securably mount marker assembly 28 to fixture 16 as shown in FIG. 4. Guide lip 58 of guide cylinder 48 may further aid in supporting marker assembly 28 to fixture 16. Lip 58 may have a slightly larger diameter than the rest of guide cylinder 48 and than the hole in plate 20 such that placing lip 58 below plate 30 prevents marker assembly 28 from moving being able to move upward toward master plate 33. Various other ways of securing marker assembly 28 within fixture 16 can be used consistently with the present invention.

Marker assembly 28 includes pneumatic air device 40, guide cylinder 48, and ink canister 52. Ink canister 52 is generally hexagonal. Ink canister 52 has felt tip 56 at one end and has a hollowed clearance area at its other end. Mounting insert 50 is press fit into ink canister 52 at its hollowed clearance area. Mounting insert 50 is configured to receive plunger 46 of pneumatic air device 40. In a preferred embodiment, plunger 46 is threadably connectable to mounting insert 50.

Guide cylinder 48 is also generally cylindrical and configured to snugly fit over threads 44 of pneumatic air device 40. Alternatively, guide cylinder 48 could be threadably connectable to threads 44 of pneumatic air device 40. Guide cylinder 48 has sufficient diameter such that it fully contains a portion of threads 44 of pneumatic air device 40, plunger 46 of pneumatic air device 40, mounting insert 50, and ink canister 52.

In operation, marker assembly 28 receives an actuation signal from actuating control device 14 via actuating signal line 24. Actuating signal line 24 is connected to pneumatic air device 40 via coupler 41. In one preferred embodiment, actuating control device 14 is a pneumatic control that produces pressurized air as the actuation signal. When coupler 41 receives pressurized air, pneumatic air device 40 actuates plunger 46 in a direction toward target plate 34. Since pneumatic air device 40 is fixed relative to plates 30, via fasteners 42 and threads 44, plunger 46 moves toward target plate 34. Since plunger 46 is coupled to mounting insert 50, which is further coupled to ink canister 52, actuation of plunger 46 in this direction also actuates ink canister 52 in this same direction toward target plate 34 and away from master plate 33. In this way, felt tip 56 is driven toward, and contacts, circuit board 18 when circuit board 18 is placed immediately adjacent target plate 34.

In one embodiment of the present invention, fixture 16 is configured such that target plate 34 is on the bottom of fixture 16 and marker assembly 28 is mounted such that felt tip 56 is immediately adjacent a circuit board that is placed at the bottom of fixture 16. In another embodiment of the present invention, fixture 16 is configured such that target plate 34 is on the top of fixture 16 and marker assembly 28 is mounted such that felt tip 56 is immediately adjacent a circuit board that is placed at the top of fixture 16. In either arrangement, test and marking system 10 operates in essentially the same way.

In the embodiment of the present invention shown in FIG. 4, guide lip 58 of marker assembly 28 is flush with target plate 34 and coupler 41 of marker assembly 28 is below master plate 33 such that marker assembly 28 is substantially completely contained between target plate 34 and master plate 33. In other words, except when plunger 46 and ink canister 52 actuate, no part of marker assembly 28 protrudes beyond target plate 34 and master plate 33. Containing marker assembly 28 this way may be important in some applications in order to keep marker assembly 28 from interfering with portions of a tester that are located outside target plate 34 and master plate 33.

In one embodiment of the present invention, actuating control device 14 is a pneumatic control that produces pressurized air as the actuation signal. When coupler 41 receives pressurized air, pneumatic air device 40 actuates plunger 46. In an alternative embodiment actuating control device can be an electrical device that produces an electrical signal that can be received by a solenoid device mounted in marker assembly 28 in place of pneumatic air device 40. In this way, the received electrical signal can energize the solenoid device actuating plunger 46 in a direction toward target plate 34. Various other electrical and mechanical arrangements will also accomplish actuating plunger 46 in a direction toward target plate 34.

Figure 5:
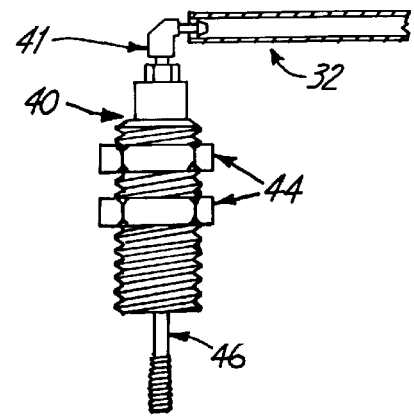
FIG. 5 is an exploded view of a marker assembly in accordance with the present invention.
Figure 5:
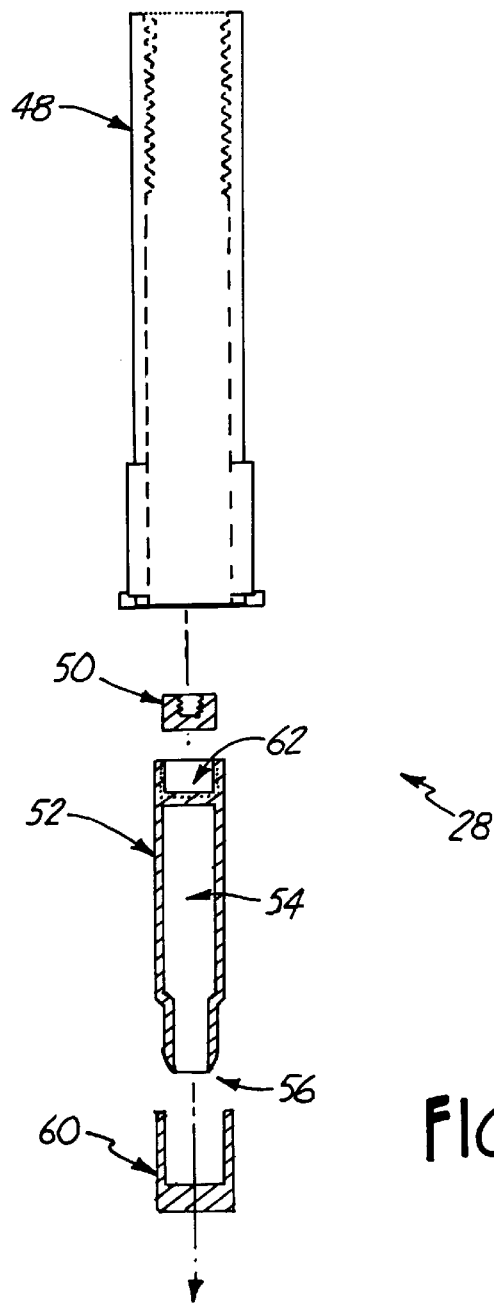

FIG. 5 shows an exploded view of marker assembly 28 in accordance with the present invention. Marker assembly 28 includes pneumatic air device 40, guide cylinder 48, mounting insert 50, ink canister 52, and cap 60. Actuating signal line 24 is connected to pneumatic air device 40 via connector 41. Plunger 46 of pneumatic air device 40 is threaded. Mounting insert 50 is configured to receive the threaded portions of plunger 46 thereby coupling mounting insert 50 to plunger 46. Ink canister 52 has a hollowed portion 62 that is configured to receive mounting insert 50. Hollowed portion 62 is configured to be shaped such that mounting insert 50 can be press fit into hollowed portion 62 and hold it in place. Once mounting insert 50 is threaded onto plunger 46 of pneumatic air device 40, ink canister 52 can then be press fit onto mounting insert 50, coupling ink canister 52 to plunger 46 of pneumatic air device 40. Ink canister 54 contains marking ink 54. Cylinder guide 48 slides over the assembled combination of ink canister 52 and pneumatic air device 40 up to fastener 44. Cap 60 can be placed over felt tip 56 in order to preserve ink 54 contained in ink canister 52.

In operation of one embodiment of the present invention, marker assembly 28 receives pressurized air at coupler 41 from actuating control device 14 via actuating signal line 24. When coupler 41 receives pressurized air, pneumatic air device 40 actuates plunger 46 in a direction toward target plate 34. Since plunger 46 is threadably coupled to mounting insert 50, which is press fit into ink canister 52, actuation of plunger 46 in this direction also actuates ink canister 52 in this same direction. In this way, felt tip 56 is driven into contact with circuit board 18 leaving ink 54 on the circuit board 18.

Ink 54 has been developed in conjunction with Walter Beard of Beard Valve Corporation of Middlebury Conn., and is designed specifically for the printed circuit board industry. Ink 54 is produced in accordance with the industry standard ink/paint specifications, IPC-650 (The Institute for Interconnecting and Packaging Electronic Circuits). Ink 54 is a permanent style ink that will adhere to most all printed circuit board substrate material. Additionally, ink 54 will hold up to the rigors of the printed circuit board manufacturing process, as outlined in the IPC 650 specification. Specifically, ink 54 will not become illegible or discolored when subjected to solutions that are normally used as cleaning agents for printed circuit boards. Thus, when ink 54 is placed on printed circuit board 18 as described in the present invention, it provides an excellent indication of whether board 18 has passed the test, and will be reliable and readable even after the rigors of the printed circuit board manufacturing process.

Ink 54 is also formulated to be very quick drying after it leaves canister 52 and is placed on printed circuit board 18. Due to the rapid stacking and handling of tested boards, ink 54 must be very quick drying. Specifically, ink 54 is formulated to dry in four to eight seconds depending on ambient conditions and the amount of ink applied. Ink 54 is also formulated to dry without additional processing. For example, ink 54 does not need to be baked or otherwise heated to fully dry. Instead, it dries in four to eight seconds after being applied to printed circuit board 18 at normal room temperature. Also, ink 54 does not require any mixing with other agents or chemicals after it leaves canister 52 in order to fully dry in four to eight seconds. It also does not require any mixing with other agents or chemicals after it leaves canister 52 in order to become permanent and withstand the rigors of the printed circuit board manufacturing process.

Typically, test and marking system 10 will be used to quickly test and mark a large number of circuit boards 18 in a short amount of time. Before testing of boards 18 takes place, cap 60 is removed from felt tip 56 to allow contact between felt tip 56 and boards 18 under test. After all the boards 18 to be tested have been tested, cap 60 should be placed back over felt tip 56 to preserve ink 54 contained in ink canister 52.

After a large enough number of boards 18 are tested, canister 52 will run out of ink 54. Canister 52 is easily replaced in accordance with the present invention. Pneumatic air device 40 is actuated using a replace command stored in the test program of control unit 12. Ink canister 52 then protrudes coat of cylinder guide 48 so that it can be pulled straight off of mounting insert 50. A new canister 52 full of ink 54 is then coupled to mounting insert 50 via hollowed portion 62. By exiting the replace command in the test program of control unit 12, ink canister 52 is retracted and normal actuation can now be continued. Cap 60 should then be placed over felt tip 56 in order to preserve ink 54 contained in ink canister 52 until additional marking and testing is completed.

In another embodiment of the present invention, ink canister 52 is replaced by an ink reservoir. The ink reservoir can be located anywhere outside marker assembly 28, but coupled therewith. In this way, marker assembly 28 does not need an ink canister 52, or could use a much smaller ink canister that is supplied with ink from the ink reservoir. Using an ink reservoir located away from, but coupled to, marker assembly 28 may be useful in situations where space in the tester is very limited. Storing the ink outside of marker assembly 28 allows marker assembly 28 to be much smaller and fit into small testers. Also, since the ink reservoir is located away from marker assembly 28 it can be much larger than ink canister 52, and thus can hold more ink and not need replenishing as often.

As discussed earlier, in the testing of printed circuit boards, size considerations are often crucial. As printed circuit boards grow increasingly small and components and connections thereto become increasingly dense, there is very little space on which a mark can be made. Furthermore, the number of test pins 26 used on test fixture 16 will increase as the density of connections on the circuit board 18 under test increases. This leaves very little space in test fixture 16 for a marker assembly 28. Consequently, marker assembly 28 is capable of fitting into a very small package. In addition, marker assembly is adaptable to be used with a variety of test fixture sizes. For instance, test fixtures may be 2.0, 3.0 and 3.75 inches from target plate 34 to master plate 33. Marker assembly 28 can be adapted to be short enough so as not to interfere with portions of the test equipment outside the area between target plate 34 to master plate 33.

In one preferred embodiment of the present invention threads 44 of pneumatic air device 40 and ink canister 52 have diameters that will fit into a guide cylinder 48 that is 2.25 inches in length and has a maximum diameter of 0.6 inches. When fully assembled, one embodiment of marker assembly 28 is less than four inches in total length with a maximum diameter of 0.6 inches. In another embodiment, marker assembly 28 can be modified so that its total length can fit between target plate 34 and master plate 33 that are separated by only 2 inches. In such an embodiment, the amount of ink 52 that can be stored in canister 54 is limited.

Although the present invention has been described with reference to preferred embodiments, workers skilled in the art will recognize that changes may be made in form and detail without departing from the spirit and scope of the invention. For example, it is contemplated that test and marking system 10 will be used with a variety of fixtures 16. Soft and dedicated fixtures have been discussed and those skilled in the art will recognize that there are many different varieties of fixtures and testers that can be used with the present invention.

Test and marking system 10 can be used in conjunction with single and dual-sided circuit testing. Where single sided testing is used, marker assembly 28 would not even have to be mounted next to pins 26 where space constraints make that too difficult. For example, marker assembly 28 could be mounted on a frame or other structure that is on an opposite side of circuit board 18 than test pins 26.

In FIG. 3, circuit board 18 is shown below fixture 16. Although not shown, circuit board 18 is typically supported on the opposite side as fixture 16 by a ram or support frame. Instead of mounting marker assembly 28 in fixture 16 as shown, it could also be mounted in the support frame. Operation of test and marking system 10 would otherwise function as explained above. In this way, when marker assembly 28 actuates against circuit board 18 it leaves a ink mark on the opposite side of board 18 than explained above.

What is claimed is:

1. A test system comprising:

a fixture having a surface that is configured to contact a circuit board;

a control unit coupled to the fixture such that it is capable of sending test signals to the fixture;

the fixture further configured to transfer test signals from the control unit to the circuit board and to transfer test signals from the circuit board to the control unit;

a marker assembly mounted in the fixture and coupled to the control unit, the marker assembly configured to receive an actuating signal from the control unit when the test signal meets selected criteria, the marker assembly comprising an actuating device and a guide cylinder; and the actuating device actuating through the guide cylinder in a direction toward the circuit board upon receiving the actuating signal such that it physically contacts the circuit board and marks it.

2. The test system of claim 1, wherein the marker assembly further comprises a marking material such that when the actuating device physically contacts the circuit board the marking material is left on the circuit board.

3. The test system of claim 2, wherein the marker assembly further comprises an ink canister that contains the marking material.

4. The test system of claim 3 wherein the ink canister has a felt tip and wherein the portion of the marker assembly that physically contacts the manufactured component leaving marking material thereon is the felt tip.

5. The test system of claim 3 wherein the guide cylinder is coupled to the actuating device and wherein the ink canister is configured to fit within the guide cylinder and wherein the total length of the actuating device and guide cylinder is less than 2.0 inches and the guide cylinder has a diameter of 0.6 inches.

6. The test system of claim 2 wherein the marking material is a specially formulated ink that dries in less than eight seconds after it is applied to the circuit board.

7. The test system of claim 2 wherein the marking material is a specially formulated ink that dries on and adheres to the printed circuit board without requiring any mixing or processing after it leaves is applied.

8. The test system of claim 2 wherein the marker assembly further includes an ink reservoir coupled to the marker assembly that fully contains and stores the marking material, which is a specially formulated ink, such that the ink stored in the reservoir does not require any mixing or processing after it leaves the reservoir and is applied to the circuit board.

9. The test system of claim 1, wherein the actuating device is a pneumatic air device with a plunger, wherein the actuating signal is pressurized air, the pressurized air delivered to the pneumatic air device, and wherein the pneumatic air device actuates the plunger in response to the pressurized air such that the plunger is driven against circuit board and marks it.

10. The test system of claim 9, wherein the actuating device further includes a ink canister containing marking material, the ink canister coupled to the plunger such that when the plunger is driven against circuit board the marking material is left on the circuit board to mark it.

11. The test system of claim 1 wherein the fixture includes a plurality of plates wherein the marker assembly is substantially contained between two of the plates in the fixture.

12. The test system of claim 11 wherein the marker assembly is mounted to the fixture through holes in the plates of the fixture.

* * * * *